United States Patent [19]
Hamel

[11] 3,904,889
[45] Sept. 9, 1975

[54] SUPERCONDUCTIVE LOGIC CIRCUIT UTILIZING JOSEPHSON TUNNELLING DEVICES

[75] Inventor: Harvey C. Hamel, Poughkeepsie, N.Y.

[73] Assignee: International Business Machines Corporation, Armonk, N.Y.

[22] Filed: June 29, 1973

[21] Appl. No.: 374,822

[52] U.S. Cl. .................................. 307/212; 307/277
[51] Int. Cl. .. H03k 3/38; H03k 19/30; H03k 19/34
[58] Field of Search ........... 307/212, 215, 218, 277, 307/306

[56] References Cited

UNITED STATES PATENTS

| | | | |
|---|---|---|---|
| 2,969,469 | 1/1961 | Richards | 307/212 |
| 3,369,127 | 2/1968 | Kaufman et al. | 307/212 |
| 3,458,735 | 7/1969 | Fiske | 307/212 X |
| 3,521,133 | 7/1970 | Beam | 307/306 X |

*Primary Examiner*—John Zazworsky
*Attorney, Agent, or Firm*—Harold H. Sweeney, Jr.

[57] ABSTRACT

A logic circuit utilizing Josephson tunnelling devices capable of providing a logical OR or NOR indication in a multi-phase time application is provided. A first current flows through a superconducting circuit having a first and second parallel branch. A plurality of Josephson devices are connected in series in the first branch of the superconductive circuit and a single Josephson device is located in the second branch of the circuit. A control means associated with the single Josephson device is operated at a first phase time for switching the device to its finite voltage state and, accordingly, causing the first current to flow through the first branch of the circuit. Further control means are associated with the plurality of Josephson devices in the first branch to cause one or more of the devices to switch to its finite voltage state at phase two time thereby causing the first current to switch back to the second branch. Output circuit means are associated with each branch of the circuit operable at phase three time for producing an output indicative of the current flow in the branch.

2 Claims, 5 Drawing Figures

SUPERCONDUCTIVE LOGIC CIRCUIT UTILIZING JOSEPHSON TUNNELLING DEVICES

BACKGROUND OF THE INVENTION

1. Field of the Invention

The invention relates to a logic circuit using Josephson tunnelling devices and more particularly, to superconductive circuitry capable of providing a logical OR or NOR indication in a multi-phase time application.

2. Description of the Prior Art

Josephson tunnelling devices are superconductive elements exhibiting a zero voltage current state in which pair tunnelling exists, and a finite voltage state in which single particle tunnelling exists. The existence of a zero voltage state in a superconductive tunnel junction was first described in July 1962 by B. D. Josephson. Since that time, these devices have been proposed for applications in memory and logic. For instance, U.S. Pat. No. 3,626,391 describes a superconductive memory using Josephson tunnelling devices in which memory cells comprised of superconducting loops are used. Josephson junctions determine the direction of current flow in the superconducting loops and they are also used for sensing the current in these loops.

U.S. Pat. No. 3,281,609 describes a logic device using Josephson tunnelling junctions in which the magnetic fields applied to the junction cause the junction to switch voltage states, depending upon whether or not the maximum zero voltage current through the junction is exceeded. Externally applied magnetic fields are used to lower the threshold current (maximum zero voltage current) of the tunnel junction so that switching to a finite voltage state occurs.

U.S. Patent application YO-9-71-074 filed June 30, 1972, Ser. No. 267,841, describes superconductive circuitry using Josephson tunnelling devices connected to a transmission line having a termination such that reflections do not result when the Josephson tunnelling device switches between two stable voltage states, in accordance with applied input signals.

Applications for Josephson tunnelling junctions are known in the prior art. However, it is not known how to utilize a Josephson device to provide a logic circuit in which the circuit is practically independent of the variations between Josephson tunnelling devices. The devices are used in a three-phase time environment and the signals utilized are, namely, clock signals of a given amplitude or control signals. For example, outputs of other logic devices are sufficient in amplitude to cause switching of the Josephson tunnelling device regardless of the variations in the units. Actually, the big problem in Josephson tunnelling devices is the ability to mass produce identical units. The use of the devices in a three-phase time environment as described herein can utilize devices which are not identical and consequently, manufacturing tolerances can be relaxed. The arrangement requires the input pulses at a particular time. However, some variation of the switching point in the Josephson tunnelling device itself is of little consequence as long as the switching signals, etc. are of sufficient strength to produce the desired switching change in the device within the desired phase timing.

Even with the knowledge of the superconducting Josephson tunnelling effect and its application to logic circuits and switching devices, it was not readily apparent how the Josephson tunnelling effect could be applied to a reliable logical OR and NOR circuit, especially one that can be incorporated into a logical tree arrangement practically.

Accordingly, it is a main object of the present invention to provide a logic circuit utilized Josephson tunnelling devices in a multi-phase time application.

It is another object of the present invention to provide a logic circuit using Josephson tunnelling devices whose speed is not dependent upon the switching speeds of the individual tunnel junction but is dependent on a specific predetermined phase timing.

It is still another object of the invention to provide logic circuits using Josephson tunnelling devices which will provide control signals to other stages of the circuitry, which control signals are relatively independent of the variations of characteristics among individual Josephson tunnelling devices.

It is still further an object of the invention to provide Josephson tunnelling device circuits which can be easily fabricated using conventional planar technology.

It is a further object of the invention to provide Josephson tunnelling device circuits separated into blocks which have the same current supply source.

BRIEF SUMMARY OF THE INVENTION

A logic circuit utilizing Josephson tunnelling devices capable of providing a logical OR or NOR indication in a multi-phase time sequence is provided wherein a superconductive circuit has a first and second parallel conductor branch. A plurality of Josephson devices are connected in series in the first branch of the superconducting circuit and a single Josephson device is located in the second branch of the superconducting circuit. Control means are associated with the single Josephson device which is operated at a first phase time for switching the device to its finite voltage state and, accordingly, causing the first current to flow through the first branch of the circuit. Further control means are associated with a plurality of Josephson devices to cause one or more of the devices to switch to its finite voltage state at phase two time thereby causing the first current to switch back to the second branch. Output circuit means are associated with each branch of the circuit operable at phase three time for producing an output indicative of the current flow in the respective branch.

It will be appreciated that the speed of the circuit is limited to the timing of the control pulses applied thereto. Since the speed is not dependent upon the characteristics of the Josephson tunnelling devices and the signals applied thereto to cause switching are of sufficient amplitude to allow the switching point to be non-critical. That is, the switching point variations due to manufacturing tolerances have a very little bearing on the operation of the circuit because of the large amplitude pulses utilized to provide the switching.

It should also be appreciated that the current applied to the logic circuits is fed through the block and can be utilized in further blocks in the tree. Thus, the current can be applied serially to the successive blocks and separate current supplies are not necessary.

DETAILED DESCRIPTION OF PREFERRED EMBODIMENTS

Figures 1, 1A:
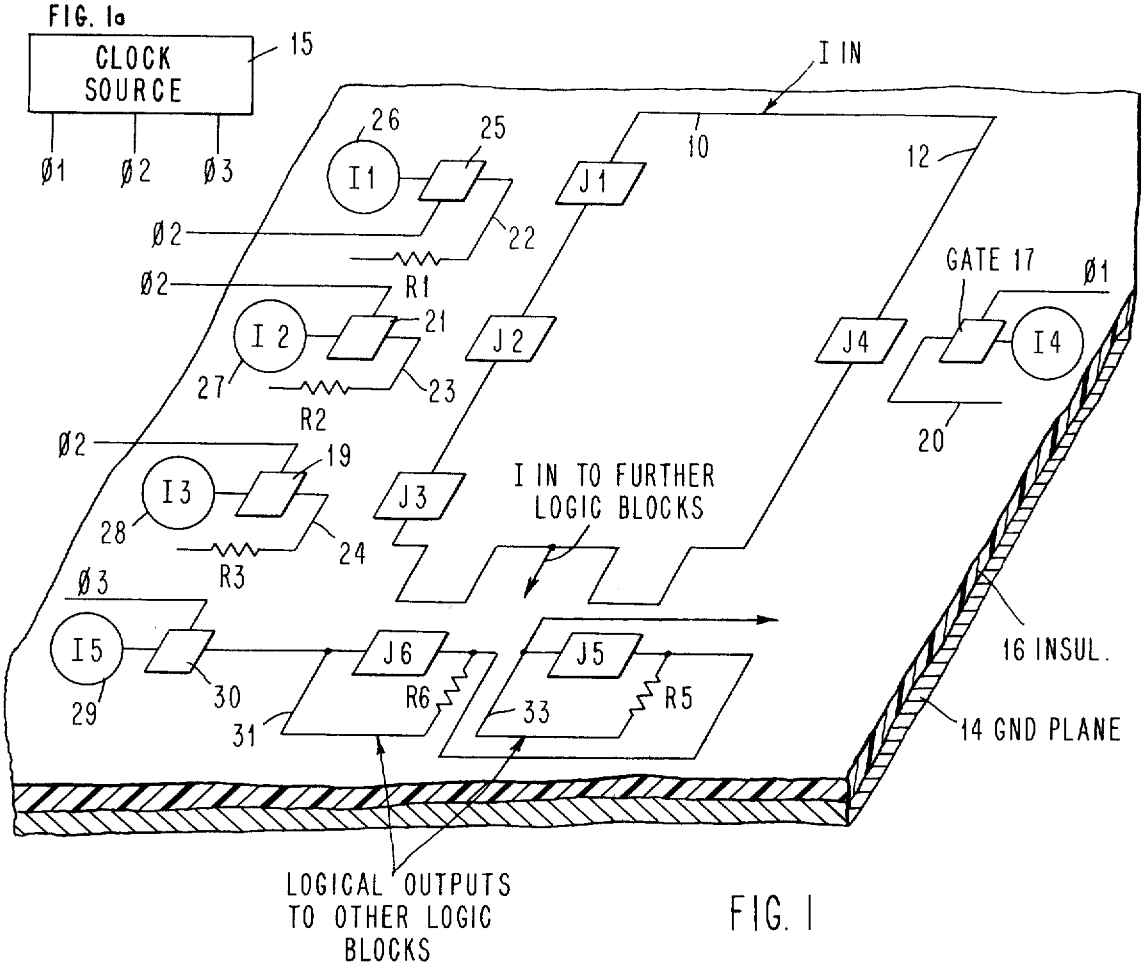
FIG. 1 is a schematic illustration of a superconductive logic circuit utilizing Josephson tunnelling devices to provide an OR or NOR logic output in a multiphase timing application.
FIG. 1*a* is a schematic illustration of a three phase clock source.
Figure 1B:
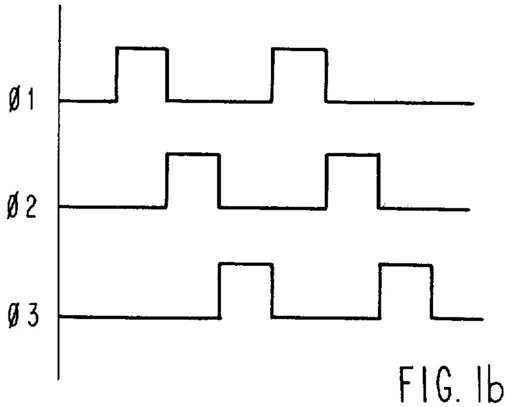
FIG. 1*b* is an illustrative diagram showing the three phase clock pulses and their timing obtained from the clock source of FIG. 1*a*.

FIG. 1 is a schematic diagram of a superconductive logic circuit utilizing Josephson tunnelling junctions in a three-phase timing sequence to provide a logical OR or NOR output.

In more detail, the superconductive circuit has a first and second branch 10 and 12, respectively, connected in parallel with respect to input current I*in*. The current does not divide between the two branches of the circuit but flows through the one path or the other depending on which branch is open to the current flow. These branch circuits 10 and 12 can consist of stripline which is insulated from a superconductor ground plane 14 by insulation 16. If desired, conventional Josephson tunnelling junctions are connected in the branch line 10. In FIG. 1, three separate junctions are illustrated as J1, J2 and J3. Theoretically, there is no limit to the number of Josephson tunnelling junctions that can be included in this branch line.

In the other branch line 12, a single Josephson tunnelling junction J4 is located. The plurality of Josephson tunnelling junctions J1, J2 and J3 located in the branch line 10 each have a first and second electrode and a tunnel barrier therebetween across which Josephson current can tunnel. The first and second electrodes of each of these junctions and the barrier therebetween are connected in series.

Similarly, the single Josephson tunnelling device located in the second branch 12 of the superconductive circuit consists of two electrodes with a barrier therebetween; the electrodes connected directly to the branch circuit 12. A first control conductor 20 is located adjacent the single Josephson tunnelling device J4. The electrical pulses are obtained from source I4 and are applied at 01 time to this first control conductor 20 to produce magnetic fields about the conductor which couple to the single Josephson tunneling device J4. The electrical pulses are obtained whenever gate 17 is opened by clock pulse 01 from clock source 15 of FIG. 1*a*. This causes the Josephson tunnelling device J4 to switch from its 0 voltage state to its finite voltage state thereby causing the current I*in* to flow through the first branch 10 of the superconductive circuit. It will be appreciated, that the Josephson tunnelling device J4 in its 0 voltage state allows the applied current I*in* to pass therethrough. However, when the Josephson tunnelling device J4 is switched to its finite voltage state the current will seek the path of no resistance, namely, branch circuit 10.

A plurality of control conductors 22, 23 and 24; one associated with each of the plurality of Josephson tunnelling devices J1, J2 and J3 shown in branch 10 of the superconductive circuit are shown in FIG. 1. These control conductors are connected to current sources 26, 27, and 28, which produce currents I1, I2 and I3, respectively. For instance, current I1 flows in control conductor 22 when gate 25 is opened by a clock pulse at 02 time and, similarly, currents I2 and I3 flow in control conductors 23 and 24, when gates 21 and 19 are energized by a clock pulse at 02 time, respectively. Depending upon the presence or absence of control current in the control conductors, the maximum Josephson current which can flow through J1, J2 or J3 is varied. That is, control currents in the control conductors establish magnetic fields which couple to the tunnel devices and affect the maximum Josephson current which can flow through the device in the 0 voltage state.

A control current in any one or more of control conductors 22, 23 and 24 will cause the associated Josephson tunnelling devices J1, J2 or J3 to switch to its finite voltage state because of the magnetic field coupling produced. The switching of any one or more of these Josephson tunnelling junctions J1, J2 and J3 in the branch circuit 10 of the superconductive circuit takes place at 02 time and causes the current I*in* to revert back to the second branch circuit 12.

Josephson tunnelling devices J6 and J5 are located adjacent branch line 10 and branch line 12, respectively. The Josephson tunnelling junctions J6 and J5 are energized at 03 time. A clock signal is applied from the clock source 15 to gate 30 gating the current I5 from current source 29 to the junctions J6 and J5 in series. The current travels through the barrier between the first and second electrodes of the devices but is below the critical current of the Josephson tunnelling device so that the devices remain in their 0 voltage state. The current in the adjacent parallel branches 10 and 12 of the superconducting circuit creates a magnetic field which affects the output Josephson devices J6 and J5 so that the critical current is exceeded and the device switches to its finite voltage state. Accordingly, which one of these two output tunnelling junctions will be put in their finite voltage state depends on which branch 10 or 12 of the superconducting circuit is carrying the current. Josephson tunnelling junction J6 will be switched to its finite voltage state when none of J1, J2 or J3 are switched into their finite voltage state. Thus, the output taken across Josephson tunnelling device J6 is a particular controlled voltage signal representing the NOR state of the circuit. Similarly, Josephson tunnelling device J5 will be switched to its finite voltage state when the input current I*in* is flowing through the branch 12 of the circuit. As mentioned above, the I*in* current will flow through this branch when any one or more of the J1, J2 or J3 Josephson tunnelling junctions are placed in their finite voltage state by one of the respective current inputs thereto on control conductors 22, 23 or 24. Accordingly, the output of Josephson tunnelling junction J5 represents the OR function. The output is a controlled voltage signal taken across the device which is only available when the device is in the finite voltage state. The respective resistors R6 and R5 are connected in the output circuit 31 and 33 of junctions J6 and J5 to prevent circulating current being trapped in the loop. These OR and NOR outputs from the superconductive circuit can be utilized as input circuits to other similar circuits in a network. When applying for example, the OR output to another OR circuit, as in a tree arrangement of OR circuits, the phase timing of the successive circuits change. That is, the output from junction J5 of the first OR circuit is at 03 time. Accordingly, if this output is applied to another OR circuit as one of the control means input to either J1, J2 or J3, it will be applied at 03 time. Accordingly, the input to junction J4 will be at 02 time and the output junctions will be energized at 01 time. The next OR circuit input will be at 01 time. Thus, the control junction J4 will be at 03 time and the output will be 02 time. The control junction J4 is always energized at the phase time immediately preceding the phase time at which the input to the OR circuit from the previous OR circuit is applied.

It should be noted that the Iin current applied to the circuit is available at the output side of the circuit and can be connected as the Iin input to a further logic circuit. Since the current passes through the branch in which the Josephson device is in its 0 voltage state, it is theoretically not reduced in amplitude because of the lack of resistance of the Josephson tunnelling devices in that state.

A two-phase system can be used with the same or a similar circuit. However, the 02 input to the output Josephson device J6 in place of the shown 03 input may require a delay adjustment to make sure that the current is applied to the Josephson device J6 simultaneously with the current Iin in the control means portion of branch 10 associated with J6.

Figure 2:
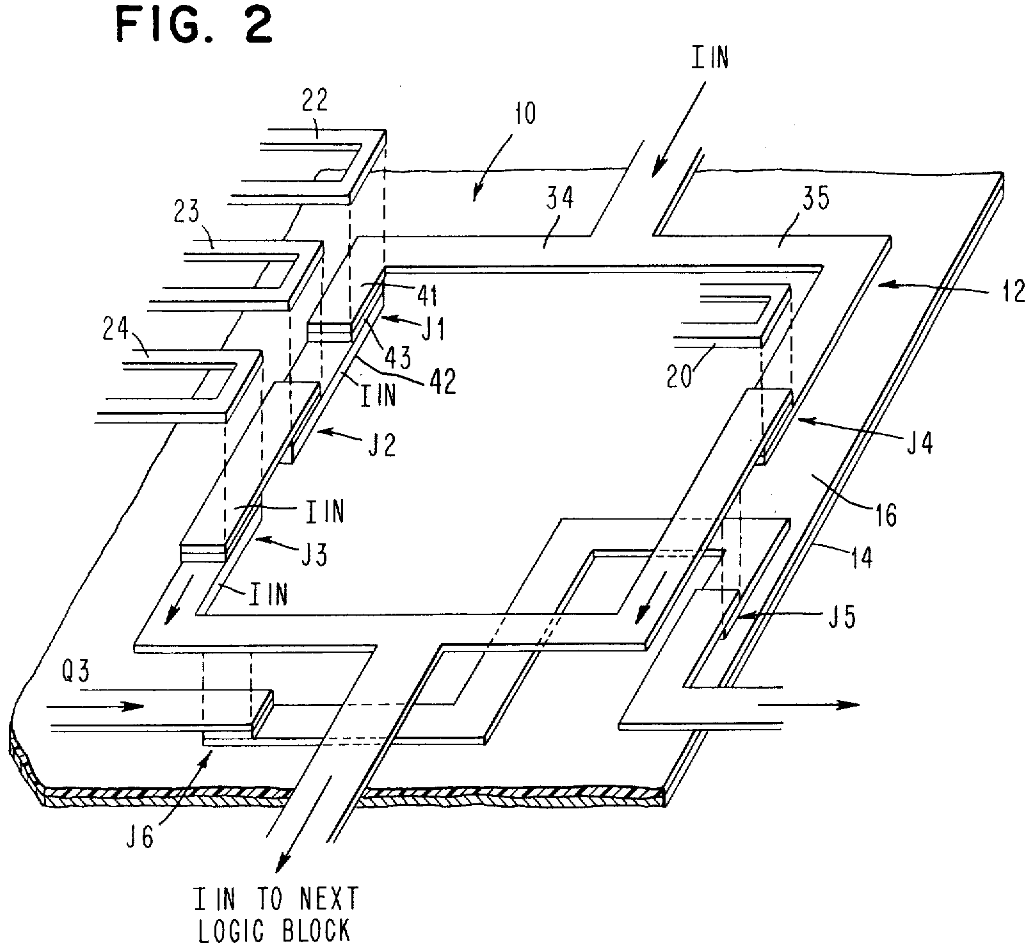
FIG. 2 is a diagram illustrating the structure of the circuit shown schematically in FIG. 1.

FIG. 2 shows the structure of the circuit illustrated in FIG. 1. Specifically, the Josephson tunnelling devices J1–J6 are illustrated along with the various control conductors and the branches 10, 12 of the circuit.

Each of the Josephson tunnelling devices J1–J6 are constructed similar and are comprised of superconducting electrodes 41 and 42 as shown in connection with junction J1 of the circuit as being representative. These superconducting electrodes are separated by a tunnel barrier 43. The electrodes are fabricated from known superconductive materials, such as lead or tin. Preferably, tunnel barrier 43 is an oxide of the base electrode, and can be, for instance, lead oxide. The manner of construction of a Josephson tunnelling junction is well understood in the art and will not be described further here.

The branch circuitry is comprised of superconductive striplines 34 and 35. As with the electrodes of the Josephson devices J1, the striplines are deposited by known processes such as evaporation or sputtering. In FIG. 2, they are deposited on an insulative layer 16 which is located over superconductive ground plane 14. The control conductors 22, 23, 24, etc. are generally superconductive lines, although they need not be superconductive. If these control conductors are the output loops of other Josephson tunnelling circuits, they will be superconductive lines. The control conductors are shown in this drawing as being located over their respective Josephson junctions.

Figure 3:
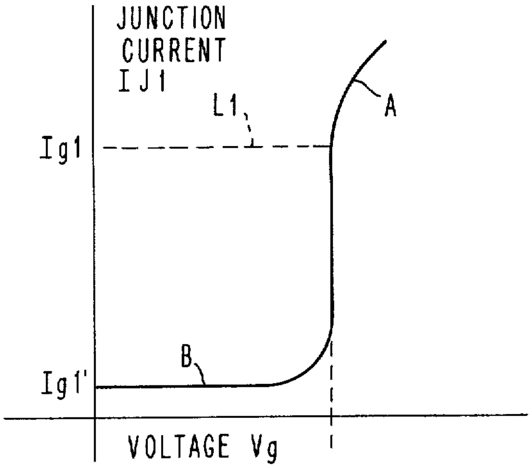
FIG. 3 is a plot of tunnel junction current versus tunnel junction voltage for a Josephson tunnel junction, used to illustrate the operation of the circuit shown in FIG. 1.

FIG. 3 shows the plot of Josephson junction current IJ1 through Josephson tunnel junction J1, plotted as a function of the voltage across junction J1. This plot shows the conventional curve denoting pair tunnelling through the junction in the 0 voltage state and single particle tunnelling through the junction in the finite voltage state. That is, current up to a magnitude of $Ig1$ will flow through the junction in its 0 voltage state. When current IJ1 through the junction exceeds this critical value $Ig1$, the junction will rapidly switch to a finite voltage state at which time the voltage across the junction will be the band gap voltage $Vg$. When current to the junction is decreased to a value less than $Ig1'$, the voltage across the junction will follow the curve indicated by portions A and B back to the 0 voltage state. The dotted line L1 will be used to explain the operation of the circuit of FIG. 1 when Josephson tunnel device J1 is switched in accordance with current applied to control conductor 22. Assume that J1 is in its 0 voltage state and a current $Ig1$ flows through device J1. If a sufficient magnetic field now couples to J1 such that the critical current through J1 falls to a value less than $Ig1$, tunnel device J1 will immediately switch to a finite voltage state. The current Iin will immediately start flowing through the other branch 12 of the circuit since the device J4 offers a 0 resistance path. The tunnel device J1 is switched to a finite voltage state following a path given by line L1. If the current IJ1 is lowered such that Iin is less than $Ig1'$, tunnel device J1 will switch back to its 0 voltage state.

Logic circuits can be built based upon the characteristics of the Josephson devices. More particularly, the circuits depend on the 0 voltage state and the finite voltage state switching ability of the Josephson tunnelling devices. The use of timing control pulses to produce the desired switching of the Josephson tunnelling devices at predetermined times has made the use of the Josephson devices possible since the circuitry is not dependent upon the characteristics of the devices being exactly the same. Thus, the devices can be utilized which differ due to manufacturing tolerances without affecting the operation of the circuit.

While the invention has been particularly shown and described with reference to a preferred embodiment thereof, it will be understood by those skilled in the art that various changes in form and detail may be made therein without departing from the spirit and scope of the invention.

What is claimed is:

1. An apparatus using Josephson tunnelling devices in a multi-phase time sequence comprising:

a superconducting circuit having a first and second parallel branch;

a first current source connected in parallel to said first and second branch for providing a first current therethrough;

a plurality of Josephson tunnelling devices connected in series in said first branch of said superconductive circuit each having first and second electrodes and a tunnel barrier therebetween across which Josephson current can tunnel, said first and second electrodes and said barrier of each Josephson tunnelling device being connected in series;

a single Josephson tunnelling device located in said second branch of said superconducting circuit;

a first control conductor located adjacent said single Josephson tunnelling device, electrical pulses in said first control conductor at phase one time producing magnetic fields which couple to said single Josephson tunnelling device causing the Josephson tunnelling device to switch to its finite voltage state thereby causing said first current to flow through said first branch of said circuit;

a plurality of second control conductors, one associated with each of said plurality of Josephson tunnelling devices, electrical pulses in said conductors at phase two time producing magnetic fields which couple to said adjacent one of said plurality of Josephson tunnelling devices causing it to switch to its finite voltage state thereby causing said first current to flow through said second branch of said circuit; and a first and second output Josephson tunnelling device, the first one switched to its finite voltage state when none of the plurality of Josephson tunnelling devices is in its finite voltage state and the second one switched to its finite voltage state when one or more of said first plurality of Josephson tunnelling devices is in its finite voltage state.

2. The apparatus of claim 1, wherein said first and second branch circuits of said superconducting circuit are comprised of stripline connected to the electrodes of said Josephson tunnelling devices.

* * * * *